US006876937B2

(12) United States Patent
Goericke

(10) Patent No.: US 6,876,937 B2
(45) Date of Patent: Apr. 5, 2005

(54) DISPLAYING A NUMBER OF MEASUREMENT CURVES

(75) Inventor: Michael Goericke, Boblingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 126 days.

(21) Appl. No.: 10/458,966

(22) Filed: Jun. 11, 2003

(65) Prior Publication Data

US 2004/0034500 A1 Feb. 19, 2004

(30) Foreign Application Priority Data

Jul. 16, 2002 (EP) .............................................. 02015811

(51) Int. Cl.[7] .............................................. G09G 5/373
(52) U.S. Cl. ..................... 702/71; 345/440.1; 702/66; 702/67; 702/68; 702/70
(58) Field of Search .............................. 702/57, 66–68, 702/70–72; 324/121 R; 345/440, 440.1

(56) References Cited

U.S. PATENT DOCUMENTS 5,579,462 A * 11/1996 Barber et al. ............... 345/440
5,898,307 A * 4/1999 Taraki et al. ................ 324/379
2001/0001137 A1 * 5/2001 Alexander ................... 702/68

FOREIGN PATENT DOCUMENTS

| DE | 2836500 | | 3/1980 |
| EP | 0267722 | A2 | 5/1988 |
| WO | WO 02/14792 | A2 | 2/2002 |

* cited by examiner

Primary Examiner—Richard Hjerpe
Assistant Examiner—Michelle K. Lay

(57) ABSTRACT

A method of displaying a number of measurement curves is described. The measurement curves are displayed in at least two windows. Each one of the windows comprises two axes. One or more measurement curves are displayed in each one of the windows. The method comprises the steps of changing the scale of one of the curves in the direction of at least one of the two axes by a user and synchronizing at least one of the other curves of one or more other windows with respect to one of the two axes depending on said change carried out by the user.

12 Claims, 2 Drawing Sheets

DISPLAYING A NUMBER OF MEASUREMENT CURVES

BACKGROUND OF THE INVENTION

The invention relates to displaying measurement curves.

It is known to enable a user to change the scale of one of a number of curves which are displayed on a display screen e.g. of a personal computer. For example, the scale of the curve selected by the user, may be enlarged with the help of a zoom function.

OBJECTS AND ADVANTAGES OF THE INVENTION

It is an object of the invention to provide an improved displaying of measurement curves. This is solved by the independent claims.

In particular, the object is solved by the invention by changing the scale of one of the curves in the direction of the two axis by a user and synchronizing all other curves of all other windows with respect to one of the two axis depending on said change carried out by the user. This allows changing scale of one of the displayed curves wherein the other curves are still comparable with the changed curve.

Embodiments of the invention, therefore, not only allow to change the scale of one of the curves by the user, but provide the feature that—if such change is carried out by the user—the scale of the other curves is synchronized with respect of one of the two axis. Due to this synchronization, and in particular to the fact that the synchronization is only carried out with respect to one of the two axes, all curves remain comparable. The change of scale of one of the curves, therefore, does not have the consequence that the other curves are not comparable anymore. Instead, the invention allows that all curves displayed on the display screen remain comparable even if the user changes the scale of one of the curves.

In an advantageous embodiment of the invention, the method comprises the further steps of setting at least one marker by the user and synchronizing the marker depending on said change carried out by the user. The user, therefore, does not have to adapt markers e.g. in the enlarged curves, but all curves including all markers are again comparable without any further effort.

The invention together with further objects, advantages, features and aspects thereof will be more clearly understood from the following description of specific examples of preferred embodiment taken in connection with the accompanying drawing.

DESCRIPTION OF PREFERRED EMBODIMENTS OF THE INVENTION

Figure 1:
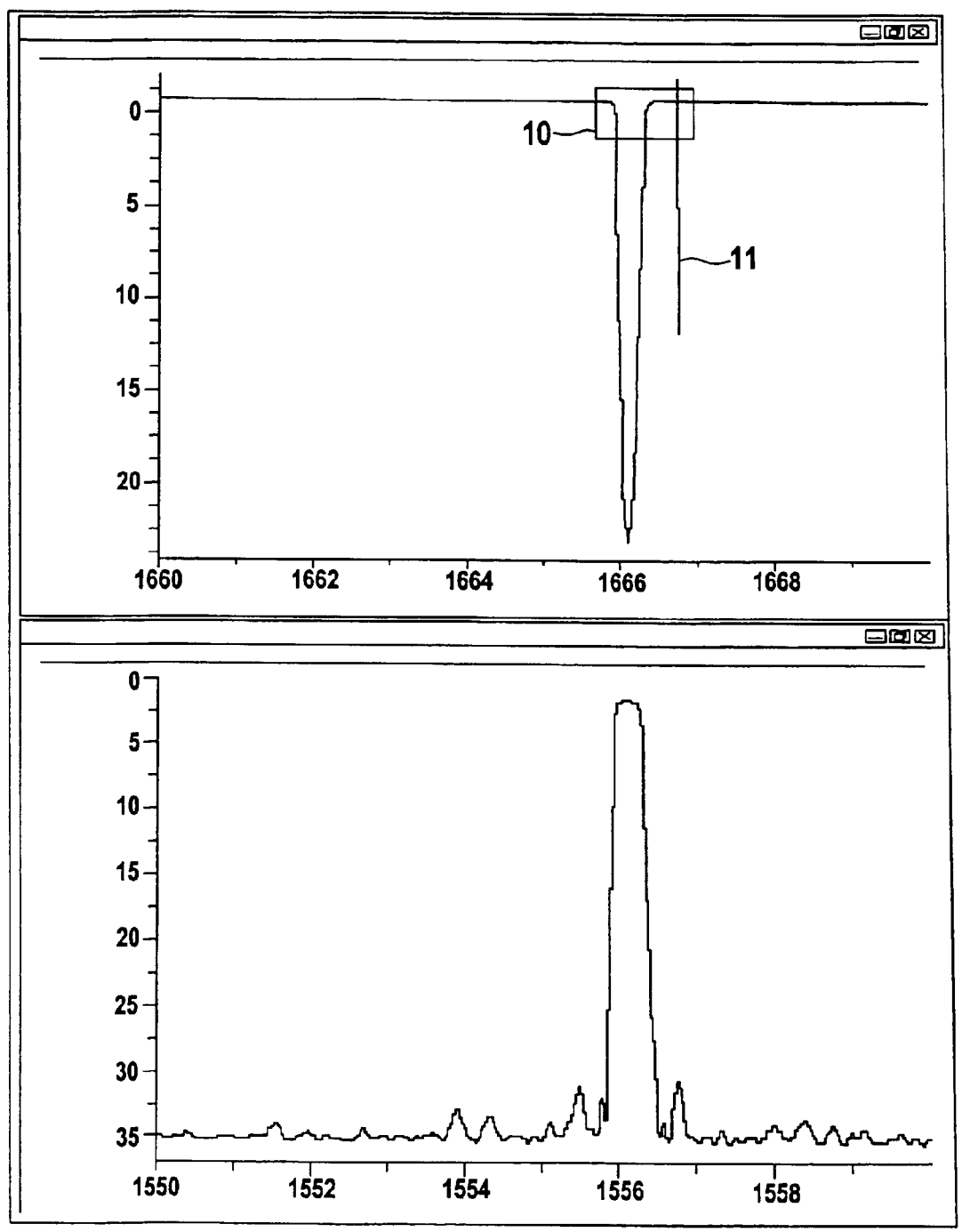
Figure 2:
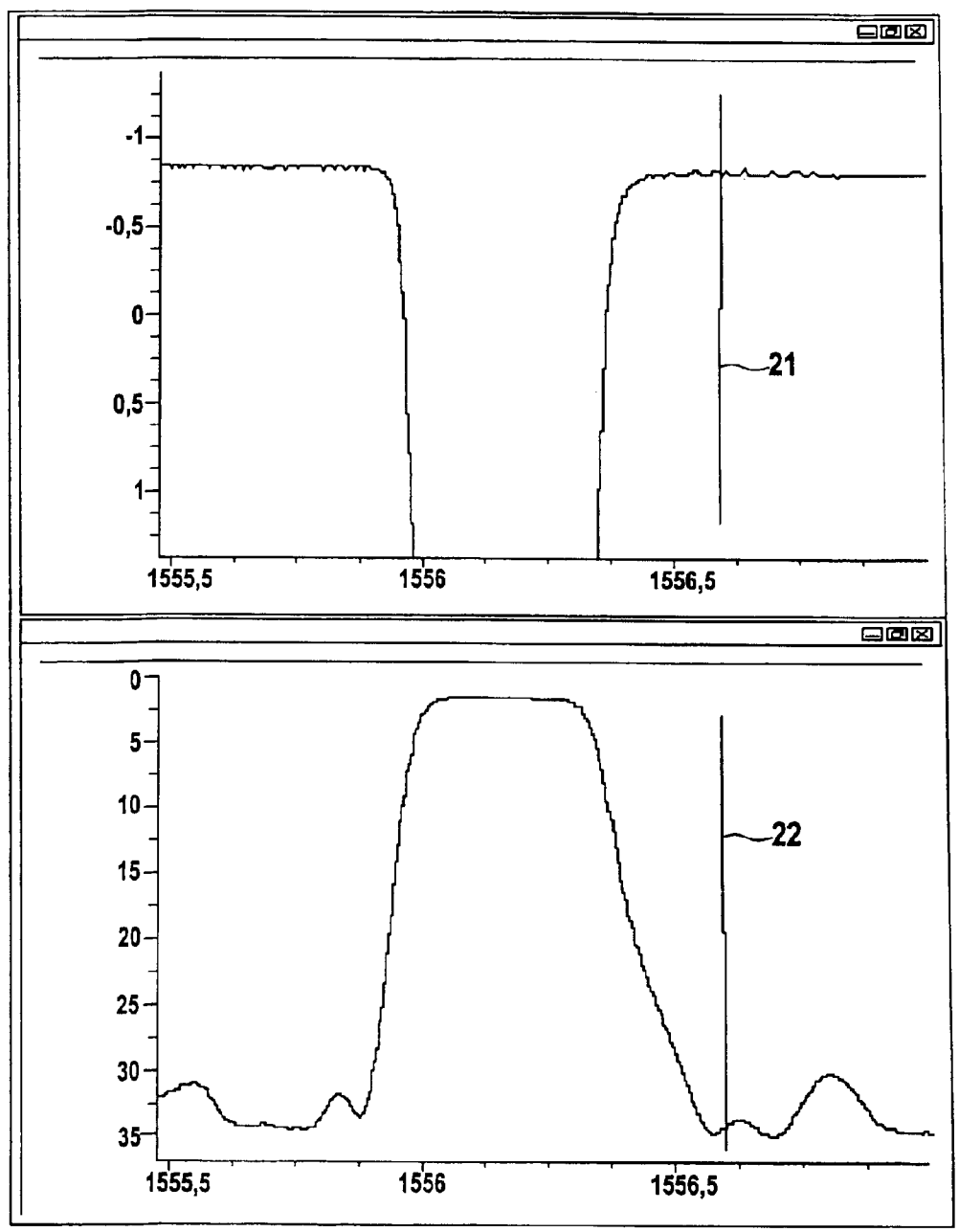

FIG. 1 is a schematic view of a window of a personal computer showing a number of curves, and FIG. 2 is a schematic view of a window of the personal computer showing the curves of FIG. 1 in an enlarged scale.

In order to test/measure e.g. optical elements like multiplexers, filters and the like, test devices are connected to these elements that send out light beams into the elements. The test devices then carry out measurements, e.g. concerning the transmission or reflection of the light beams, and generate one or more measurement curves with the results of the measurements. These measurement curves are then displayed on a display screen (e.g. of the test device) so that a user is able to examine the measurement curves and e.g. to check whether the elements work properly or not.

FIG. 1 shows two exemplary examples of measurement curves. Each curve is provided within a so-called window. It is possible that one and the same window comprises not only one but two or more measurement curves. However, a specific window only comprises measurement curves of the same type, e.g. of a transmission or of a reflection of a light beam. The windows are displayed at least on parts of the display screen (or even on multiple separated screen simultaneously), and each of the windows may be manipulated separately.

The upper curve of FIG. 1 relates to the transmission of a light beam and the lower curve to the reflection of a light beam. For both curves, a diagram is provided with two axes, i.e. an x- and a y-axis, with the attenuation (in db) being depicted over the wavelength (in nm). As can be seen in FIG. 1, each one of the two curves has one peak wherein the peaks of the two curves are directed—due to the different types of the two curves—in different directions.

It is assumed that the user enlarges the scale of the upper curve of FIG. 1. For that purpose, the user may create a rectangle around that part of the upper curve which is of interest and which therefore shall be enlarged. This rectangle may be created e.g. with the help of a mouse or other kind of pointing device in a known manner. The rectangle is shown in the upper curve of FIG. 1 and is depicted with reference numeral 10. However, other ways for enlarging as known in the art can be applied accordingly.

The scale of one of the curves of FIG. 1 is the ratio between one unit of the wavelength and the corresponding length on the axis of the wavelength, e.g. 1 nm per 2 cm.

In order to enlarge the scale, a so-called zoom function is provided. The result of the zoom function is shown in FIG. 2. The zoom function may be carried out automatically after creation of the rectangle by the user or only after a subsequent specific request by the user.

FIG. 2 shows two measurement curves. As already described in connection with the curves of FIG. 1, the curves of FIG. 2 are also provided within a window which is displayed at least on parts of the display screen of the test device.

The upper curve of FIG. 1 corresponds to the upper curve of FIG. 2 and the lower curve of FIG. 1 corresponds to the lower curve of FIG. 2. However, the curves of FIG. 2 are shown in an enlarged scale compared to the curves of FIG. 1.

As can be seen from the upper curve of FIG. 2, only that part of the upper curve of FIG. 1 is displayed there which is marked by the rectangle 10 of the upper curve of FIG. 1. Therefore, the scale of the upper curve of FIG. 2 is enlarged compared to the scale of the upper curve of FIG. 1. As a result, the upper curve of FIG. 2 only shows that part of the measurement curve, which is of interest for the user and which, therefore, was marked by the user with the help of the rectangle.

As can be seen from a comparison of the upper curves of FIGS. 1 and 2, the scale of the upper curve of FIG. 2 is enlarged in the direction of both axis compared to the upper curve of FIG. 1.

As can be seen from FIG. 2, the scale of the lower curve is also enlarged. However, in connection with the lower curve of FIG. 2, in this example only the scale in the direction of the x-axis, i.e. the wavelength, is enlarged but not in the direction of the y-axis, i.e. the attenuation. In the direction of the y-axis, the attenuation comprises the same values in both lower curves of FIGS. 1 and 2.

The enlargement is carried out identically in the direction of the x-axis for both curves of FIGS. 1 and 2, i.e. the two curves are enlarged with the same factor and therefore to the same scale.

As a result, the zoom function enlarges the upper curve of FIG. 1 as marked by the user and creates the upper curve of FIG. 2 that is enlarged in both directions, i.e. the x- and the y-axis. However, the lower curve of FIG. 1 is only partially enlarged by the zoom function so that the lower curve of FIG. 2 is only enlarged with respect to the x-axis.

As mentioned, it was the user who has enlarged the scale of the upper curve of FIG. 1. However, the user did not enlarge any other of the curves of FIG. 1. As mentioned, this was done automatically or on request of the user.

This means in more general words that—under the condition that the user enlarges one of the curves displayed in one of the windows of FIG. 1—not only the selected curve is enlarged, but also all curves of all other windows of FIG. 1 are enlarged. However, the curves in all other windows are only enlarged with respect to one of the two axes whereas the curve selected by the user is enlarged in the direction of both axes.

In connection with those curves that are enlarged only in the direction of one axis, the other axis relates to that parameter which is different for the different types of curves in the different windows. E.g., for the transmission and the reflection of a light beam, it is the attenuation that is different for these two types of curves so that it is also the attenuation that is not enlarged. This can be seen from the values that are depicted at the x-axis of the upper and lower curves of FIGS. 1 and 2 that are different.

The upper curve of FIG. 1 is provided with a marker 11. The marker 11 defines a specific position in the direction of the x-axis. The marker 11 may be set and/or moved and/or removed by the user, e.g. by a mouse or other pointing device. Of course, there may be further markers that are set in connection with the upper curve of FIG. 1 or with any other curve.

After the described zoom function is carried out, the marker 11 of the upper curve of FIG. 1 is present as a marker 21 within the upper curve of FIG. 2. The positions of the markers 11 and 21 of FIGS. 1 and 2 are identical with respect to the direction of the x-axis.

As a result, the zoom function not only enlarges the scale as described above but also corrects the position of a marker that is present in connection with the selected enlarged curve.

Furthermore, it is possible that the zoom function not only corrects the position of a marker but also creates a new marker within the lower curve of FIG. 2 wherein this new marker 22 has the identical position as the corrected marker 21.

The same automatism may be carried out if the user applies the zoom function in connection with the lower curve of FIG. 1. As well, the automatism may be carried out if the user reduces the scale of one of the curves of FIG. 1. If, therefore, the user changes the scale of one of the curves of FIG. 1, all other curves of FIG. 1 are synchronized in the described manner depending on this change carried out by the user, so that the scale of all curves of FIG. 2 in the direction of one axis remains the same.

What is claimed is:

1. A method of displaying a number of measurement curves, wherein the measurement curves are displayed in at least two windows, wherein each one of the windows comprises two axes, wherein one or more measurement curves are displayed in each one of the windows, comprising the steps of changing the scale of one of the curves in the direction of at least one of the two axes by a user and synchronizing at least one of the other curves of one or more other windows with respect to one of the two axes depending on said change carried out by the user.

2. The method of claim 1 wherein the scale of the at least one of the other curves is changed such that the scale of the curves remains the same in the direction of the one of the two axis.

3. The method of claim 1 wherein the other one of the two axes that is not synchronized relates to that parameter which is different for different types of measurement curves in the different windows.

4. The method of claim 1 wherein the other one of the two axes which is not synchronized is the y-axis.

5. The method of claim 1 wherein the scale of said one of the curves is enlarged/reduced by the user and that the scale of the other curves is enlarged/reduced identically with respect to the one of the two axes.

6. The method of claim 1 wherein the change of the scale of said one of the curves is carried out by the user with the help of a rectangle preferably created with the help of a pointing device.

7. The method of claim 1 comprising the further steps of setting at least one marker by the user and synchronizing the marker depending on said change carried out by the user.

8. The method of claim 7 wherein the marker is set in connection with one of the two axes preferably with the help of a pointing device.

9. The method of claim 1, wherein each one of the windows only contains one type of measurement curve/s.

10. A computer program on computer readable media, with program instructions for carrying out the method of claim 1, wherein the computer program is run on a test device.

11. The computer program of claim 10, wherein the program instructions are stored on a digital storage media that is readable by the test device.

12. A test device for displaying a number of measurement curves, wherein the measurement curves are displayed in at least two windows, wherein each one of the windows comprises two axes, wherein one or more measurement curves are displayed in each one of the windows, wherein the test device is adapted such that a user may change the scale of one of the curves in the direction of at least one of the two axes and that at least one of the other curves of one or more other windows are synchronized with respect to one of the two axes depending on said change carried out by the user.

* * * * *